United States Patent [19]

DiNozzi et al.

[11] Patent Number: 4,501,064
[45] Date of Patent: Feb. 26, 1985

[54] MICRO COMPONENT ASSEMBLY MACHINE

[75] Inventors: Robert D. DiNozzi, Beverly, Mass.; Stanley R. Vancelette, Manchester, N.H.; Lionel E. Powell, Natick, Mass.; George F. McLean, Jr., Middleton, Mass.; Leon F. Sleger, Wakefield, Mass.; Ronald C. Mason, Hamilton, Mass.

[73] Assignee: USM Corporation, Farmington, Conn.

[21] Appl. No.: 299,979

[22] Filed: Sep. 8, 1981

[51] Int. Cl.[3] .......................... H05K 3/30; B23P 19/00
[52] U.S. Cl. ......................................... 29/832; 29/740; 209/573; 228/6 A
[58] Field of Search ................. 29/704, 740, 741, 739, 29/759, 834, 840; 228/5.5, 6 A; 209/573; 198/394, 395, 343; 414/416, 627, 786; 406/63, 67, 68

[56] References Cited

U.S. PATENT DOCUMENTS

| 3,039,604 | 6/1962 | Bickel et al. | 209/573 X |
| 3,106,290 | 10/1963 | McGrath | 324/73 AT |
| 3,144,938 | 8/1964 | Wahl | 324/73 AT |
| 3,386,774 | 6/1968 | Strydom | 406/68 |
| 3,450,259 | 6/1969 | Waltz | 209/573 |
| 3,819,046 | 6/1974 | Klema et al. | 209/573 X |
| 3,937,386 | 2/1976 | Hartleroad et al. | 29/760 X |
| 4,307,832 | 12/1981 | Taki et al. | 228/6 A X |
| 4,320,339 | 3/1982 | Vancelette | 209/573 X |
| 4,327,482 | 5/1982 | Araki et al. | 228/6 A X |
| 4,346,514 | 8/1982 | Makizawa et al. | 228/6 A X |

Primary Examiner—Howard N. Goldberg
Assistant Examiner—Carl J. Arbes
Attorney, Agent, or Firm—Alan N. McCartney

[57] ABSTRACT

A machine for automatically placing chips or similar micro-electronic components on a substrate carried on an X-Y type table, the machine having means to supply components, means to convey the components, means to transfer the components from the supply source to the conveyor, the conveyor transporting the components to a placement head located above the substrate to place the component on the substrate. The machine can also include a station for applying an adhesive or similar means on the substrate to adhere the component on the substrate.

20 Claims, 10 Drawing Figures

MICRO COMPONENT ASSEMBLY MACHINE

BACKGROUND OF THE INVENTION

This invention relates to machines for automatically placing chips or similar micro-electronic components on printed circuit substrates.

With the advent of the use of chips or similar micro-electronic components on printed circuit boards it has become desirable to develop an assembly apparatus for quickly and reliably placing the component on the board. Further, such a machine must automatically function in response to software controls to obtain the high production speeds desirable to meet the needs of the demand for high numbers of such assembled printed circuit boards.

Because of the small size of the components it has been physically difficult to develop hardware that provides automatic placement of the component on the substrate with any degree of speed, uniformity or reliability. Attempts to accomplish this objective are illustrated in U.S. Pat. Nos. 3,499,203, and 3,453,714, however these devices do not perform every function necessary to completely automate the assembly in the manner of this invention. Machines of this type use a rotary turret device with pickup heads that pick up the component from a source and place the component on a substrate. These devices lack the assembly speed necessary for high production. Other types of placement devices are known as gangbonding machines, U.S. Pat. No. 4,127,432, where a plurality of heads pick up and place the component—but again these machines lack the necessary speed and reliability. Other machines merely use a movable head that picks up and places the component on the substrate. An example of this machine is shown in U.S. Pat. No. 3,611,561. These machines also cannot obtain the desired high speed assembly rates.

With respect to the gangbonding machines, they have theoretical high production rates. However, they are not computer programmable and require manual set-up and changeovers for board design changes and production run changes. Further, they are not reliable in that they require a secondary repair state (often manual) to replace components missing in the machine. They are also dependent on conventional components being present from prior operations.

Thus, it is desirable to provide flexibility in a machine that is computer programmable with on-line repairability.

SUMMARY OF THE INVENTION

It is the primary object of this invention to provide a machine for placing a chip type component on a printed circuit substrate wherein the machine automatically performs every function from receipt of the component to placement of the component on the substrate.

To accomplish this objective, the substrates are positioned on a X-Y axis table for application of an adhesive between the conductive lands of the printed circuit substrates. The substrates are then positioned to a component placement head that places a preselected component on the conductive lands of the substrate.

Associated with the assembly table is apparatus for taking the component from a supply source, transferring the component to a conveyor, checking or verifying the acceptability of the component and then transporting the component to the placement head. With this machine, a tube feed, bulk feed or tape feed component supply means can be utilized. The entire apparatus is software controlled so that each operation occurs in its proper sequence for a rapid, repetitive and reliable assembly of the component to the board.

The supply source orients the component and feeds the component to a transfer mechanism which places the component in an air track type conveyor. The component passes through the conveyor to a verifier which determines the acceptability of the component. If the component is the one desired for a particular predetermined location on the substrate, the verifier permits the component to travel down the air track to a placement head.

The verifier also measures the component and signals the placement head the component dimension to cause proper positioning of the component receiving means in the head. A vacuum pickup in the placement head picks up the component and positions it on the substrate at the location of the droplet of adhesive between the conductive leads. After all components have been placed on the substrate (or in association with other component placement apparatus) the substrate can be processed through conventional solder application means to complete the entire component to substrate assembly.

It is also an object of this invention to provide a component placement machine in which a plurality of similar or dissimilar components can be supplied to the placement station to provide versatility and speed of assembly to the machine.

The machine can also be provided with a plurality of adhesive supplying heads and placement heads operating in synchronism so that a plurality of components can be placed on the substrate during one sequencing of the machine operation.

The machine is also provided with sensors at predetermined locations to indicate proper component placement with respect to each phase of operation of the machine.

The invention also includes a blow-tube or air track conveyor system for conveying the components to create a random access device. That is, a plurality of supply means can be used to supply various components, the supply being controlled by software so that a preselected component can be produced for assembly to the substrate.

BRIEF DESCRIPTION OF THE DRAWINGS

Attention is now directed to the preferred embodiment shown in drawings which illustrate.

DESCRIPTION OF THE PREFERRED EMBODIMENT

This invention is described in association with components such as chips. However, it will become obvious that any micro-electronic component can be assembled to a substrate with the use of the various mechanisms that make up the novel overall combination.

Figure 1:
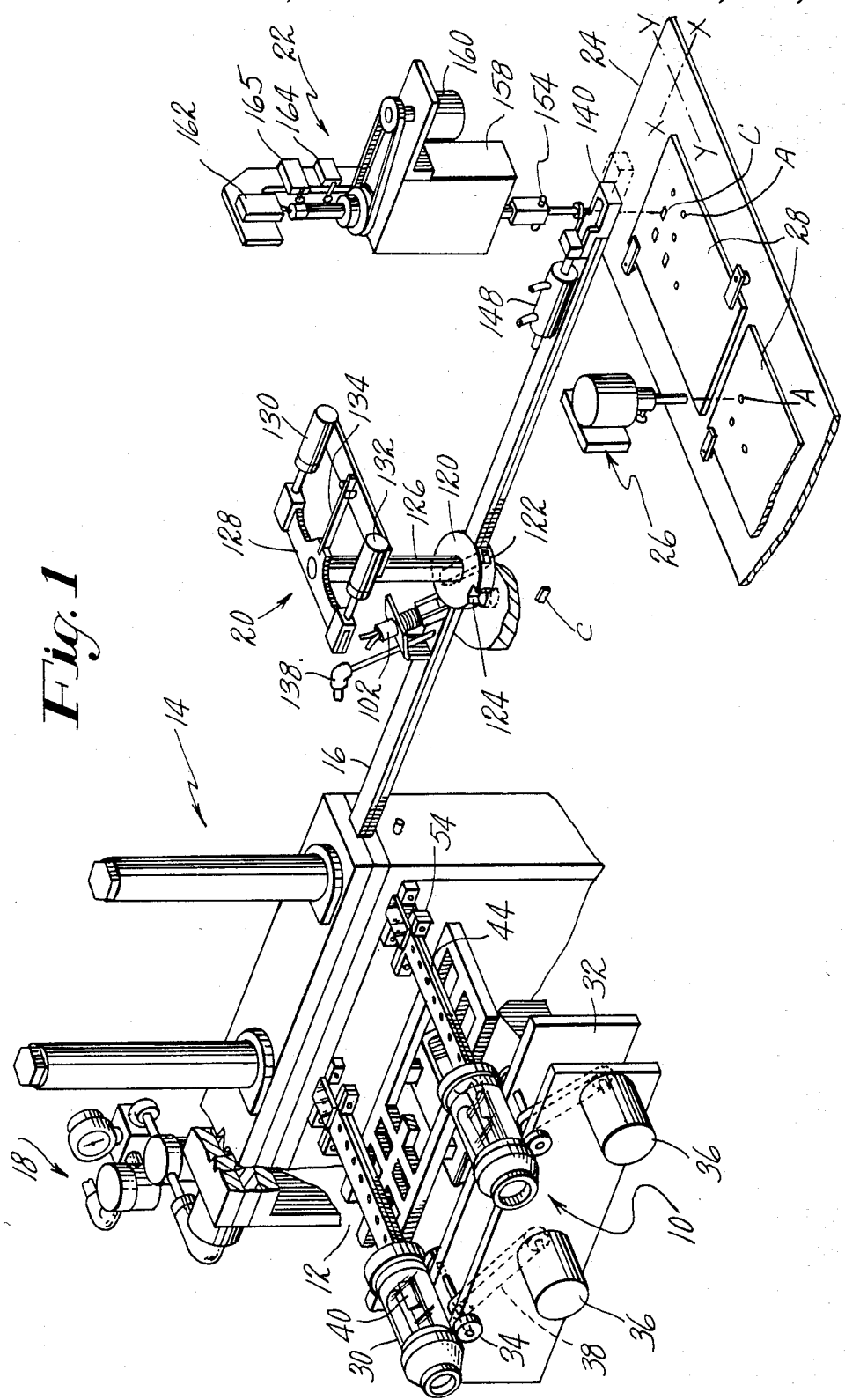
FIG. 1 is a diagramatic illustration of the overall machine of this invention.
Figure 2:
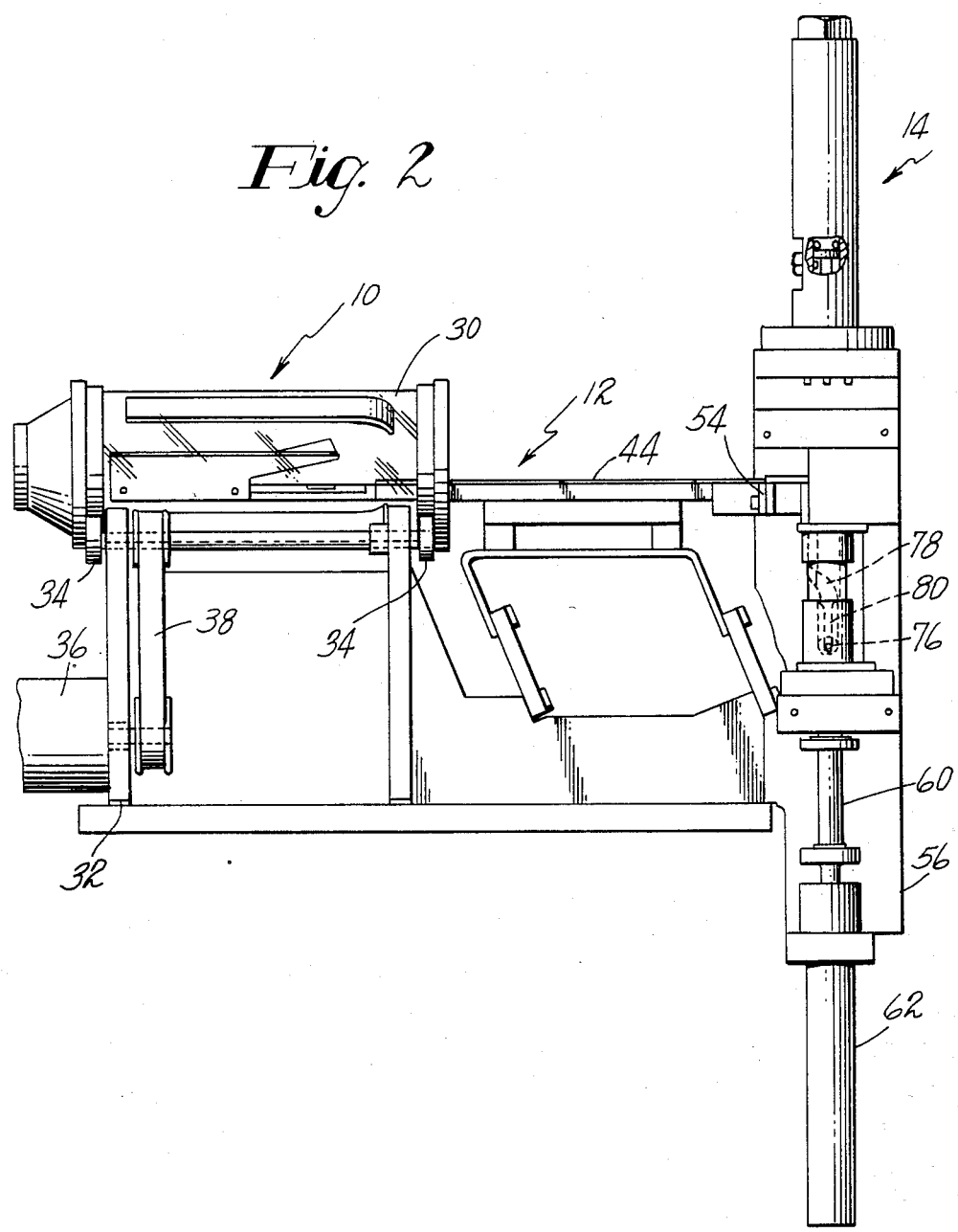
FIG. 2 is a side elevational view of one of the supply means, the component feeder and transfer mechanism.

Attention is now directed to FIG. 1 which illustrates the overall machine which takes components such as chips "C" from a bulk source 10, separates and orients the chips in a linear vibratory feeder 12, and transfers the chips through mechanism 14 to an air track conveyor 16 which has an air source 18. The chips are conveyed to a verifier 20 which permits acceptable chips to pass down the track to a placement head 22. Positioned below the placement head 22 is an X-Y table 24 carrying substrates 28. Associated with the table 24 is an adhesive application apparatus 26 which applies an adhesive "A" between the conductive lands of the board to which the chips are applied at the placement station.

The source of the components illustrated is a bulk feeder but a tape feed or tube feed type arrangement can also be used with the machine. The source is a container 30 supported at 32 to be rotatively driven by rollers 34 driven by a motor 36 with drive belts 38. A single motor drives each container since in a multiple source application, some of the containers may be stationary and not used for a given assembly.

Figure 3:
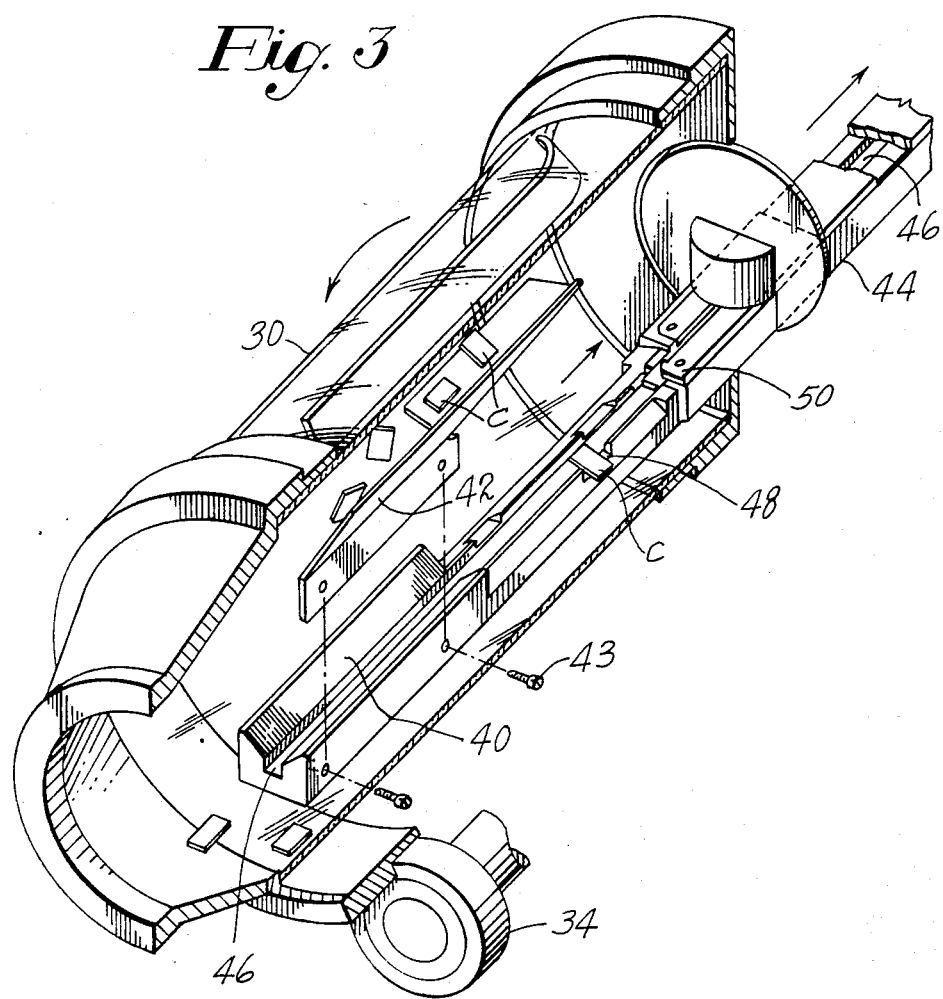
FIG. 3 is a perspective view partially broken away of the supply means and component orienter of the feeder.
Figure 4:
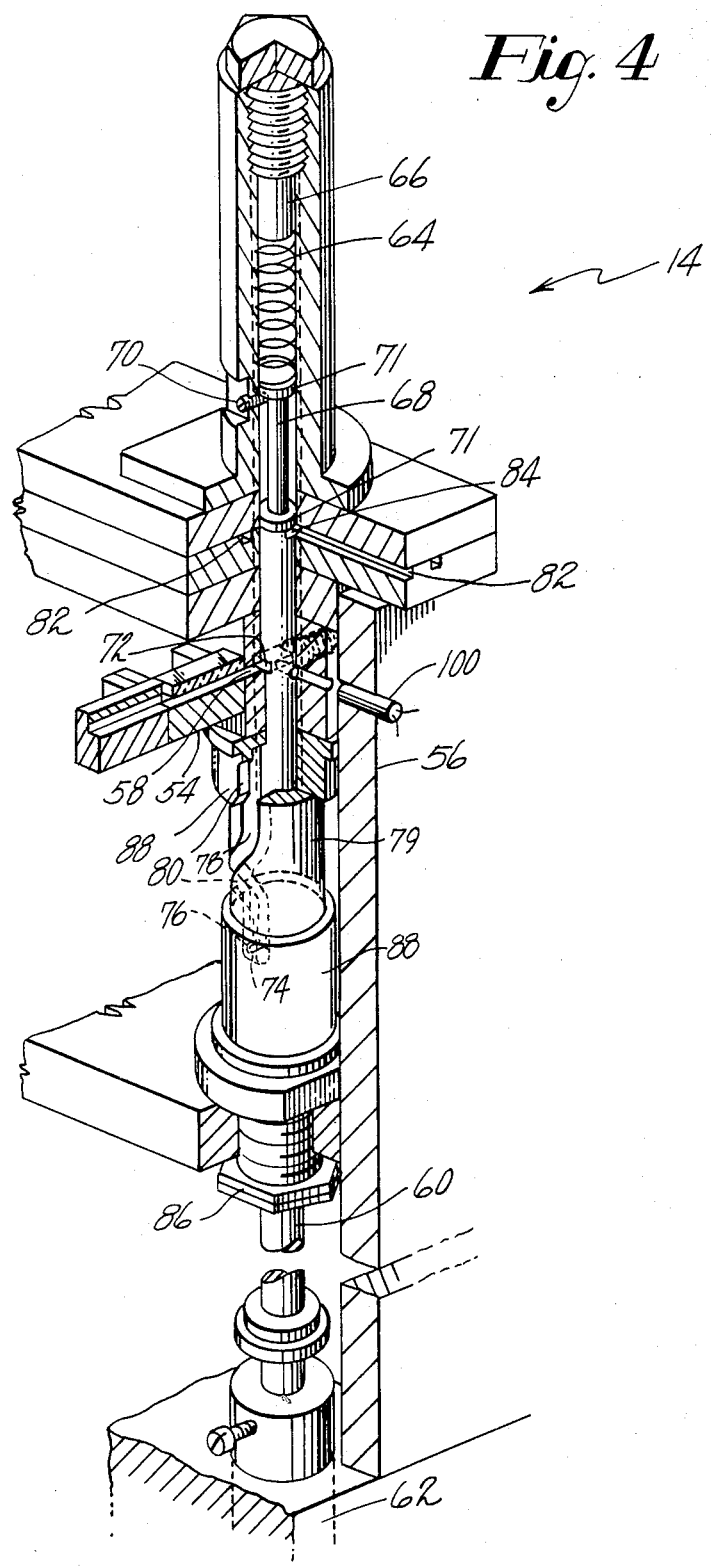
FIG. 4 is a perspective view partially broken away of a transfer mechanism.

The vibratory feeder 12 has a component orienter 40 carried within the container 30 (See FIG. 3). A pickup vane 42 attached to track 44 picks up chips as the container 30 is rotated and allows the chips to fall onto the track. The track 44 has a slot 46 for receiving the chips. As the track is vibrated back and forth, the chips will travel down the track. Positioned on the track is a component ejecter which will cause the chips which are not properly positioned in the slot 46 to fall back into the container. If a chip is sideways to the slot, a shoulder 48 permits the chip to fall back into the container. If the chip is standing on end in the slot 46, the finger 50 will eject the chips. Thus, the feeder will only permit the chips which lay flat into the slot 46 to pass down the feeder.

The vibratory feeder 12 moves the track 44 back and forth causing the chips to move toward the transfer mechanism. The vibratory feeder is of the type illustrated in U.S. Pat. No. 2,918,590.

The track 44 is connected to the housing 56 of the transfer mechanism by an elastomeric coupling 54 which absorbs the vibration of the track and aligns the track slot with the chip opening 58 in the transfer housing 56.

The transfer mechanism 14 comprises a transfer rod 60 which is moved by an air cylinder 62 against a return spring 64 held in the transfer housing by a plug 66. The spring 64 acts on the transfer rod 60 through a return rod 68 which has lands 71. A lock screw 70 in the transfer housing contacts the lands 71 and limits the up and down movement of the transfer rod.

A component receiving opening 72 accepts the chips aligned in the feeder track. The transfer rod is rotated in its up and down movement so that chips received from the feeder into opening or slot 72 of the rod are placed into the component opening 82 in the air track. A roller 74 and pin 76 are carried on the transfer rod. The roller rides in cam slot 78 in sleeve 79 and the pin locates in cam slot 80 of fixed sleeves 88. As the transfer rod is moved upwardly by the air cylinder 62 the roller rides up cam 78 and rotates the rod. As the rod moves toward a top position the pin 76 rides into the locating cam slot 80 to precisely position the opening 72 of the rod with the air track opening. An adjustment sleeve 86 is also provided permitting positioning of sleeve 88 to precisely align the opening 72 with the air track component slot.

Therefor, as a particular chip is required, the air cylinder 62 is activated to raise the transfer rod 60 and position a chip into the air track. Return spring mechanism 64 forces the rod downwardly upon release of the air pressure to reposition the rod for receipt of another component. The transfer rod 60 has an air slot 84 permitting air and chips from adjacent transfer mechanisms to pass down the track after the rod 60 has returned to its lower position.

Figure 5:
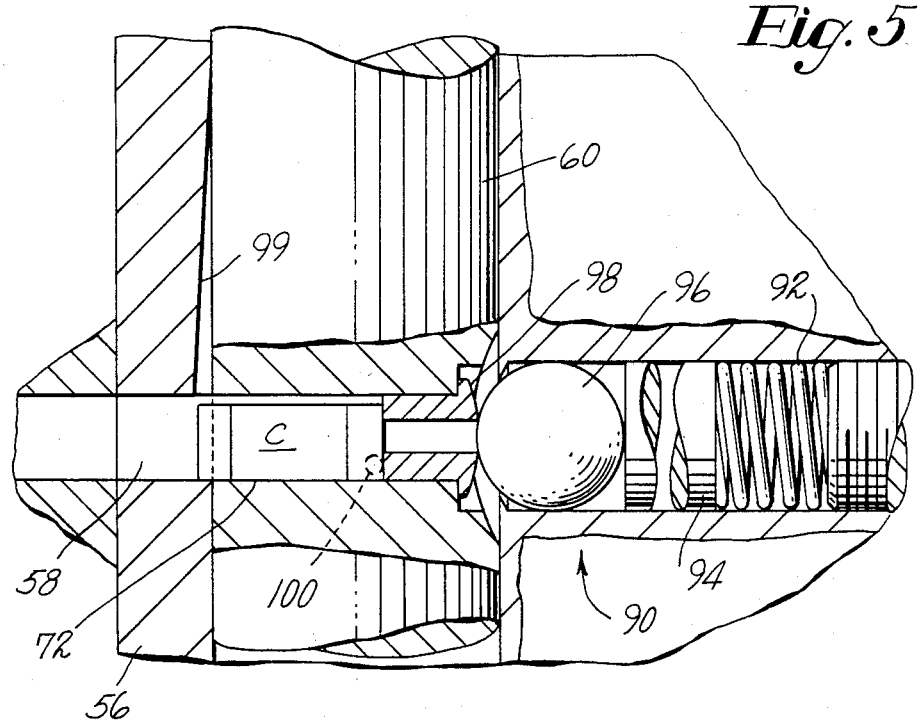
FIG. 5 is an enlarged view of the component receiving portions of the transfer mechanism.
Figure 6:
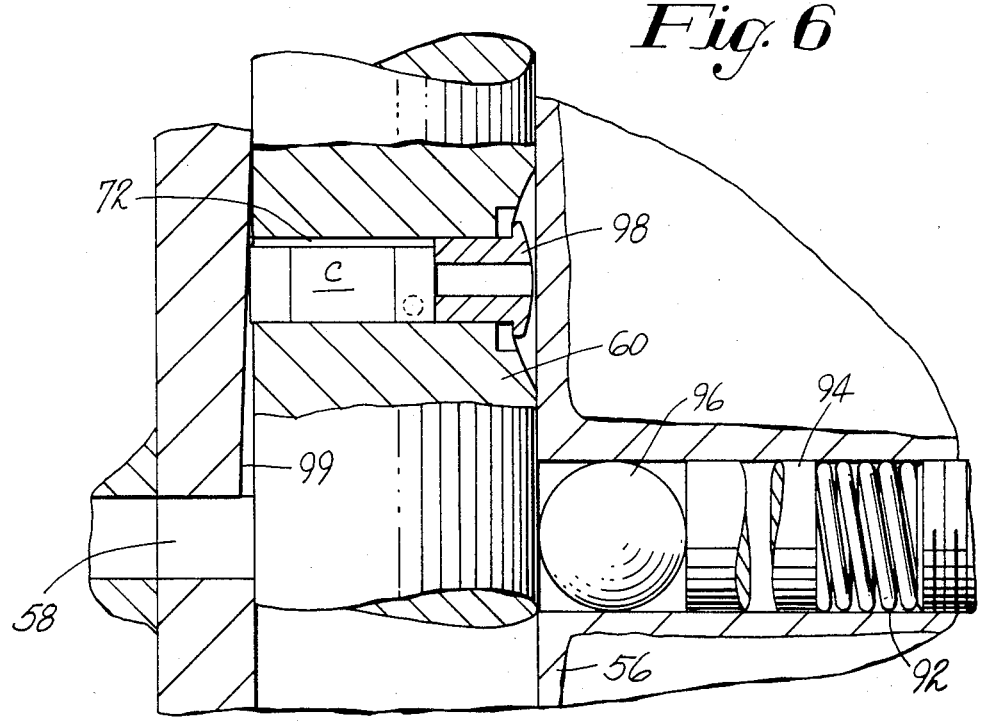
FIG. 6 is an enlarged view similar to FIG. 5 and illustrating the component being moved in the transfer mechanism.

The transfer mechanism also includes a chip selector mechanism 90 (see FIGS. 5 & 6) that selects a single chip for transfer into the air track. This mechanism is carried in the housing and comprises a spring 92 acting on a ball 96 through a plug 94. The ball 96 positions a chip receiving plug 98 against which the chip transferred from the feeder will rest. As the transfer rod is raised, the plug 98 releases from the ball 96 and the chip rides up cam 99 in the housing to ride inwardly into the component slot 72. This action is illustrated in FIGS. 5 and 6.

The transfer housing also has a sensor 100 located adjacent slot 72. When the transfer rod is in the down position, the sensor indicates whether a chip is in place in the slot 72. This sensor can be opposed openings in the housing through which a light beam passes to indicate a chip is in place and to indicate the chip has passed out of the transfer housing.

Figure 7:
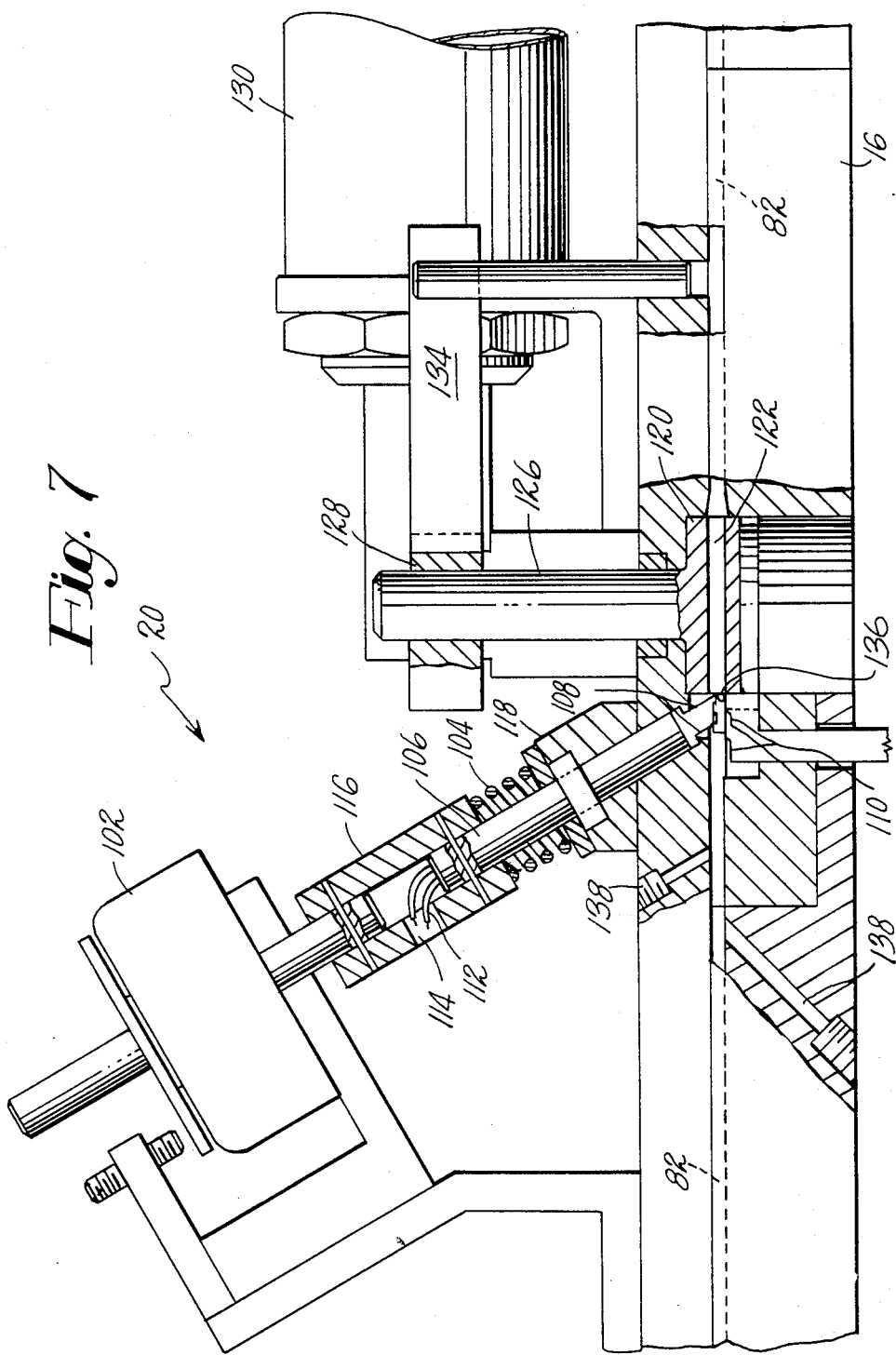
FIG. 7 is a side elevational view of the component verifier.

After a chip or similar type component has been transfered from the feeder to the air track, the chip passes down the air track to a verifier which determines whether the proper chip has been selected from the source. The verifier is illustrated in FIG. 7 and comprises a chip in verifier sensor and a movable contact rod or sleeve 106 biased by a spring 104 against the action of solenoid 102. The rod 106 carries upper contacts 108. A pair of lower contact 110 are positioned in the air track so that the chip can be tested whether its leads extend from the top or bottom of its body surface. Wires 112 connected to the contacts 108 extend through opening 114 in sleeve 116. The spring 104 acts against a fixed support 118 so that the contacts 108 are normally retracted. Action of the solenoid however, places the contacts against the chip leads to verify acceptability of the chip, as illustrated in FIG. 7.

The verifier also includes a head 120 which has an opening 122 through which acceptable chips can pass and a relieved area 124 through which unacceptable chips are rejected. The head 120 is rotated by a rod 126 attached to a linkage 128 controlled by solenoids 130 and 132.

When a chip passes down the track to the verifier, it is stopped by the verifier head 120 and its presence is indicated by the chip in verifier sensor. The solenoid 102 is then energized and the contacts 108,110 engage the chip lands. If a particular chip is indicated acceptable, the solenoid 130 is activated rotating rod 126 and head 120 to align the opening 122 with the air track and permit the chip to travel down the air track. If, however, the chip is not the correct one or is unacceptable, solenoid 132 is activated to align opening 124 with the air track and reject the chip. Thereafter, the proper transfer mechanism can again be activated to pass another acceptable component to the verifier. This permits on-line repairability to the entire machine. A leaf spring 134 keeps linkage 128 centrally positioned with the head 120 in a position to receive a chip for testing. Also incorporated in the verifier is a chip measuring sensor 136 that signals the chip receiving head the length of the chips so that the chip can be centered on the placement head, as will become apparent hereinafter.

Since the chip is stopped in the verifier an additional air supply 138 can also be used to assist in moving the chip out of the verifier and down the track.

Figure 8:
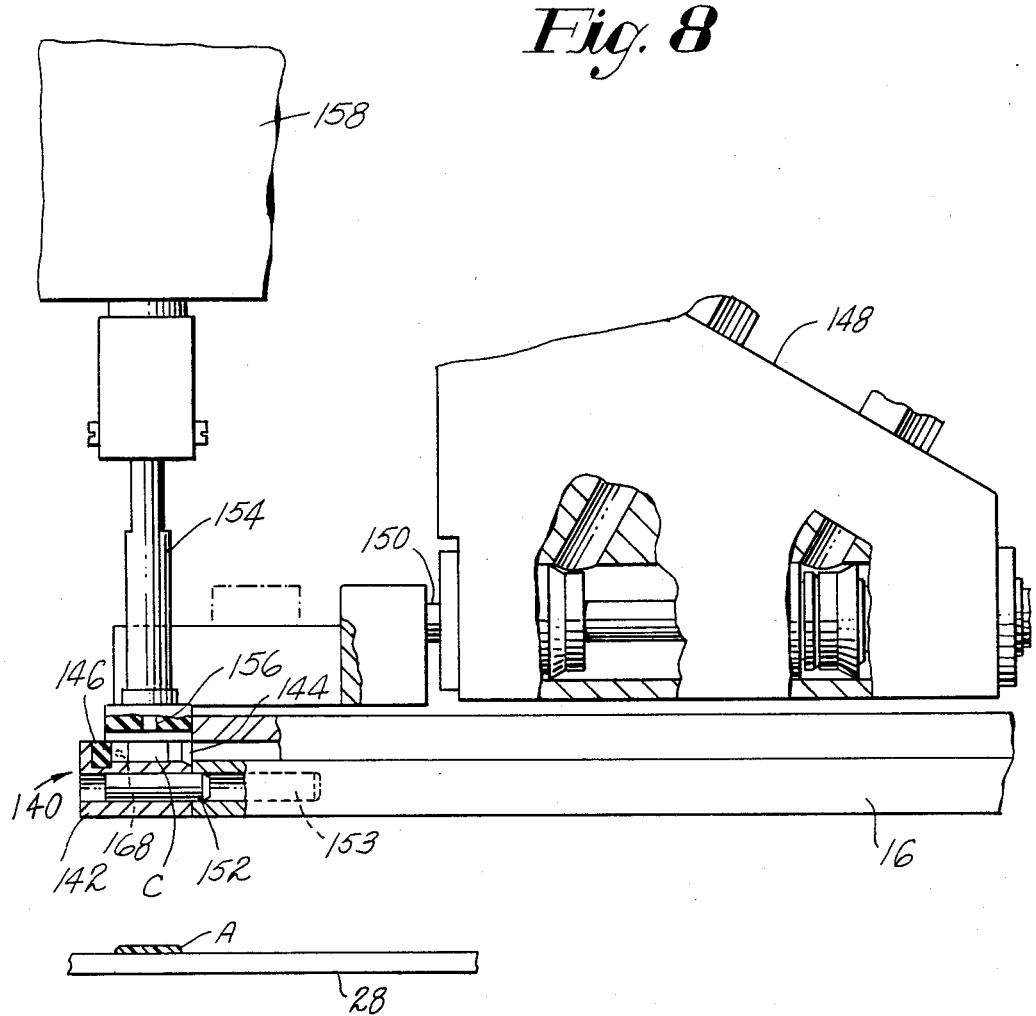
FIG. 8 is a side elevational view of the placement head in the component receiving position.
Figure 9:
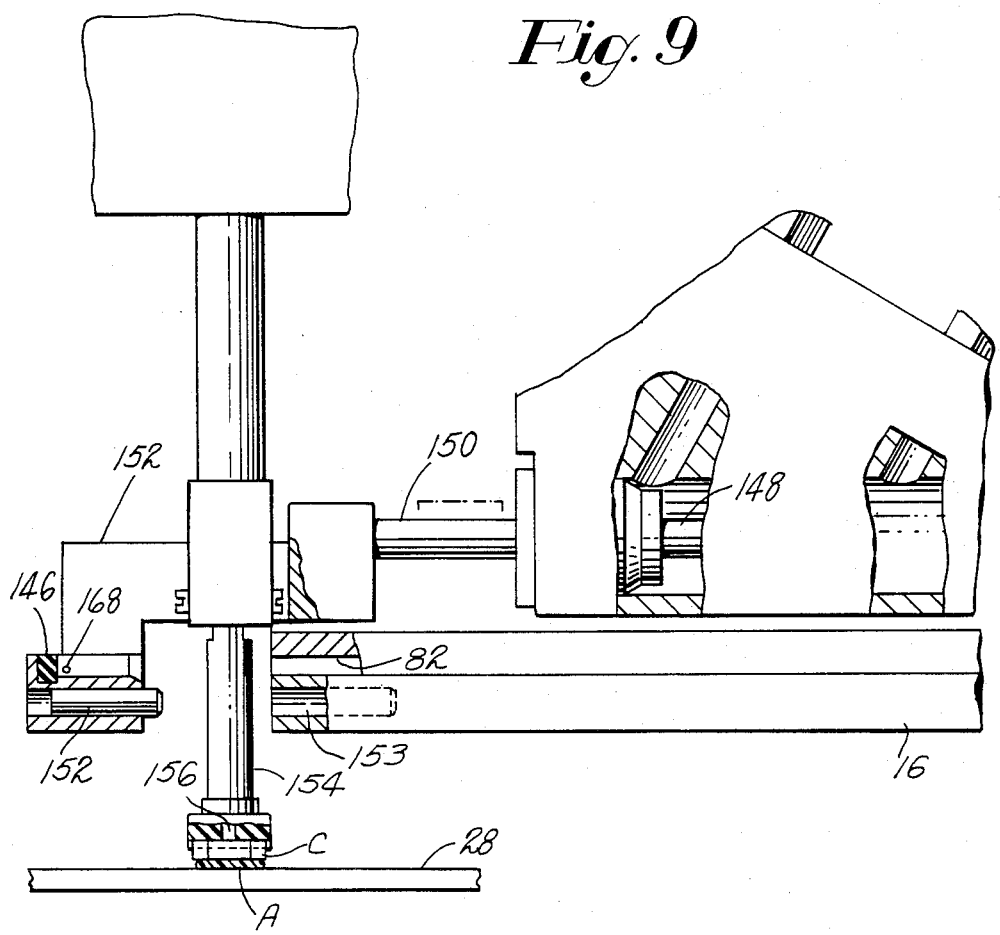
FIG. 9 is a side elevational view of the placement head in the component placing position.
Figure 10:
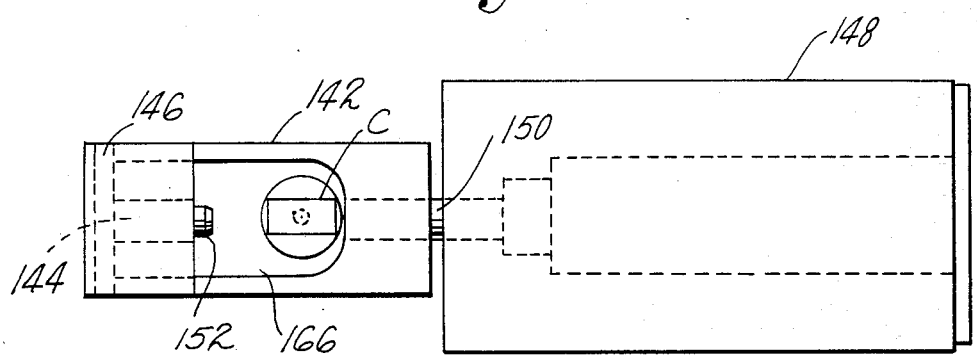
FIG. 10 is a top plan view of the component receiving shelf of the placement head.

Attention is now directed to FIGS. 8 to 10 which disclose the novel placement head mechanism of this invention. As the component travels down the track from the verifier, it is stopped in a receiving head 140 which has a shelf 142 with an opening 144 for receiving the chip. An elastomeric bumper stop 146 is used adjacent to the opening 144 to absorb the momentum of the chip and permit the chip to stop on the shelf. The receiving head 140 is supported by a double acting air cylinder 148 through piston rod 150. In this fashion, the shelf can move in and out away from a displacement head 154. As the receiving head 140 is moved toward the track, a locating pin 152 is received in opening 153 in the track end to properly align the track opening with the component opening 144 in the receiving head 140.

The placement head 154 has a vacuum opening and is controlled for up and down movement by an air cylinder mechanism 158. The head 154 is also mounted for rotational movement and is driven by a motor and drive connection 160 (see FIG. 1).

In operation, the position of shelf 142 with respect to pickup head 154 is determined by the solenoid or motor controlled rear stop of air cylinder 148 which has previously been programmed by the sensor in the verifier which has measured the component length. Thus, as the component is received in the shelf, the component will be centered with respect to the pickup head. Thereafter, a chip in position sensor 168, signal causes the vacuum pickup head to remove the component from the shelf and the shelf moves forward. The pickup head is rotated through drive means 160 so that the component is in proper relationship to the conductive lands of the board. Thereafter, the head 154 moves downward through shelf opening 166 to place the component on the adhesive "A" which was placed on the substrate at the previous station. At this point, the vacuum in the head is released and the component remains on the substrate.

The placement head may also include head-up, head-down and head-clear position indicators 162, 164 and 165 as illustrated in FIG. 1. An additional sensor 168 is also included in the shelf to indicate that a chip is in place in the shelf.

With the machine described, a component can be randomly selected from a source, feed to a transfer mechanism which positions the component in an air track conveyor which transports it to a verifier for determination of acceptability. The component is then transported to a placement head which positions the component on a substrate. This entire apparatus is software controlled so that each portion of the machine functions in its proper sequence.

A plurality of sources each carrying a different type of component can be utilized in a given application with controls permitting random selection of a given component for application to a substrate or predetermined location of the substrate.

Further, a plurality of placement heads could be used on a "W-axis". In this mode, a central placement head would be mounted stationary and opposed heads on each side of the central head could be movably mounted and controlled for movement toward and away from the central head. In this fashion, three heads could be controlled for component application to the substrate simultaneously. The programmable "W-axis" positioning aids in increasing the number of simultaneous fire possibilities, thereby greatly enhancing the overall production rate. In this latter arrangement, an adhesive application mechanism of a similar type with three heads operating on a W-axis would also be used so that adhesive would be applied to the predetermined electrical points on the substrate prior to components being applied to those electrical connectors.

The overall machine described can also be used to automatically place other micro-electronic components on a substrate. This merely requires adapting the various portions of the apparatus to the general contour of the component. For example, if a leadless cylindrical component was to be placed, the component receiving portion of the feeder, transfer mechanism, conveyor, verifier and placement head would be shaped to accommodate the configuration of that particular component. Thus, it can be seen that the arrangement of the parts of this novel combination will permit the application of any micro-electronic component to the conductive lands of a substrate.

Having thus described my invention what I desire to secure Letters Patent of the United States is:

1. The method of placing chip-type micro-electronic components on a printed circuit board comprising:
   a. providing a plurality of component supply means each having a plurality of components;
   b. selecting a component from a component supply means;
   c. transferring a component to an enclosed conveyor;
   d. transporting a component in the enclosed conveyor to a receiving means;
   e. transferring a component from the receiving means to a placement means;
   f. placing a component on a printed circuit board.

2. The method of claim 1 including verifying in the conveyor that the selected component is acceptable.

3. A machine for automatically placing chip-type electronic components on the conductive lands of a substrate, said machine comprising:
   a. a component supply means located on support means and containing a plurality of components;
   b. a conveyor having one end located on said support means for transporting the components from said supply means for receiving means;
   c. means to transfer the components from said supply means and place the components on said conveyor;
   d. a verifier coacting with said machine and located on said conveyor to determine whether a given component is acceptable;
   e. means to receive said components from the opposite end of said conveyor;

f. said receiving means including a placement head adapted to receive the component from said conveyor and position the components on the substrate at a predetermined desired location;

g. said conveyor including an air track that passes through the transfer mechanism and transports the components to the placement means, and h. electrical control means associated with said machine functional to actuate each element of the machine in proper sequence.

4. The machine of claim 3 wherein said component supply means includes means to separate the components so that each component is individually supplied to said transfer means.

5. The machine of claim 3 wherein said supply means contains components of different types for supply to said transfer means.

6. The machine of claim 3 wherein said transfer means is a mechanism to transfer components from the supply means to said conveyor for transport of the components to the placement head.

7. The machine of claim 3 wherein said verifier is located on said conveyor and receives the components for measurement and testing and permits transport of the acceptable components down the conveyor to the placement head.

8. The machine of claim 3 wherein said placement head contains means for receiving said component from said conveyor and means for picking up the components and placing the components on the substrate.

9. The machine of claim 8 wherein said verifier measures the components and signals that measurement to the head receiving means to properly position the components with respect to said pickup means so that the components are properly positioned on the substrate.

10. The machine of claim 3 wherein sensor means coacts with said receiving means and said placement head to indicate proper component position.

11. The machine of claim 3 including means for supplying an adhesive to the substrate.

12. The machine of claim 11 including electrical control means to operate the adhesive supply means and placement head in synchronism so that as one substrate receives components from the placement means, a preceeding substrate receives an adhesive.

13. The machine of claim 11 wherein a plurality of adhesive supplying means and a plurality of placement means are provided, each operating in synchronism so that a plurality of components can be placed on a plurality of substrates at one time.

14. A machine for automatically placing chip-type micro-electronic components on a substrate comprising:
a. a plurality of component supply means located on a support means;
b. a conveyor located on said support means;
c. a plurality of transfer mechanisms located on said support means, each transfer mechanism being adapted to receive components from said supply means and deposit the components in one end of said conveyor;
d. said supply means being in a stationary relationship with respect to said transfer mechanisms; and
e. a component placement means coacting with the opposite end of said conveyor to receive a component from said conveyor and to place any one of the supplied components to the substrate, and
f. said conveyor including an air track that passes through the transfer mechanism and transports the components to the placement means.

15. The machine of claim 14 wherein a component verifier coacts with said conveyor to determine whether a component is acceptable and permits acceptable components to travel to the placement means.

16. The machine of claim 14 wherein said source of supply is a plurality of component supplies each of which coacts with said conveyor.

17. The machine of claim 14 wherein said conveyor is an enclosed track which contains pressurized air that conveys the components to the receiving means.

18. A system for automatically placing chip-type electronic components on the conductive lands of a substrate, said system including modular machine units and comprises;
a. a first unit located on support means comprising a plurality of component supply means, each adapted to carry a plurality of components;
b. a conveyor unit located on said support means for transporting the components;
c. said first unit having means for transferring the components from said supply means onto one end of said conveyor;
d. a placement head unit adapted to receive components from the opposite end of said conveyor and position the components on the substrate at a predetermined desired location;
e. said system including electrical control means functional to actuate each unit of the system in proper sequence;
f. said conveyor including an enclosed air track between said supply means and said placement head whereby the path of the components between said supply means and said placement head is defined by at least said air track.

19. The system of claim 18 wherein said supply means is a plurality of component supplies each of which coacts with said conveyor unit.

20. The system of claim 18 wherein said conveyor unit is an enclosed track which contains pressurized air that conveys the components to the placement head unit.

* * * * *